United States Patent
Tran et al.

(10) Patent No.: US 12,206,221 B2
(45) Date of Patent: Jan. 21, 2025

(54) WAVELENGTH-CONTROLLED TUNABLE CHIP-SCALE LASER

(71) Applicants: Minh Tran, Goleta, CA (US); Tin Komljenovic, Goleta, CA (US)

(72) Inventors: Minh Tran, Goleta, CA (US); Tin Komljenovic, Goleta, CA (US)

(73) Assignee: Nexus Photonics Inc, Goleta, CA (US)

( * ) Notice: Subject to any disclaimer, the term of this patent is extended or adjusted under 35 U.S.C. 154(b) by 754 days.

(21) Appl. No.: 17/468,953

(22) Filed: Sep. 8, 2021

(65) Prior Publication Data

US 2023/0072680 A1    Mar. 9, 2023

(51) Int. Cl.
*H01S 5/0687* (2006.01)
*H01S 5/026* (2006.01)

(52) U.S. Cl.
CPC ............ *H01S 5/0687* (2013.01); *H01S 5/026* (2013.01)

(58) Field of Classification Search
CPC .............................. H01S 5/026; H01S 5/0687
See application file for complete search history.

(56) References Cited

U.S. PATENT DOCUMENTS

| | | | | |
|---|---|---|---|---|
| 5,617,234 | A  * | 4/1997 | Koga | H04B 10/572 398/95 |
| 6,678,480 | B1 * | 1/2004 | Aoki | G02B 6/4286 398/183 |
| 7,042,579 | B2 * | 5/2006 | North Morris | G01J 9/02 356/519 |
| 2003/0095736 | A1 * | 5/2003 | Kish, Jr. | H04B 10/2914 385/37 |
| 2003/0218759 | A1 * | 11/2003 | Lee | G01J 9/0246 356/519 |
| 2012/0262721 | A1 * | 10/2012 | Rakuljic | G01D 5/266 356/477 |

\* cited by examiner

*Primary Examiner* — Michael Carter
(74) *Attorney, Agent, or Firm* — Shalini Venkatesh (57) ABSTRACT

A device comprises three elements, realized as photonic integrated circuits. The first element comprises a tunable semiconductor laser emitting light at a laser output wavelength. The second element comprises a wavelength selective element, coupled to the first element. The third element comprises N photodetectors where N>=2, coupled to the second element. Light coupled into the second element from the first element is de-multiplexed by the wavelength selective element such that a ratio of light power coupled from the second element into one of the N photodetectors to light power coupled from the second element into another one of the N photodetectors is a function of the laser output wavelength. The responses of the N photodetectors facilitate at least one of measurement and control of the laser output wavelength.

9 Claims, 8 Drawing Sheets

WAVELENGTH-CONTROLLED TUNABLE CHIP-SCALE LASER

FIELD OF THE INVENTION

The present invention relates to optical sources. More specifically, certain embodiments of the invention relate to tunable chip-scale semiconductor lasers with improved wavelength control and stability.

BACKGROUND OF THE INVENTION

Semiconductor lasers are solid-state lasers based on semiconductor gain media. Most semiconductor lasers are laser diodes, which are pumped with an electrical current in a region where n-doped and p-doped semiconductor material meet. However, there are also optically pumped semiconductor lasers, where carriers are generated by absorbed pump light, and quantum cascade lasers, where intra-band transitions are utilized.

Common materials for semiconductor lasers (and for other optoelectronic devices) are: GaAs (gallium arsenide), AlGaAs (aluminum gallium arsenide), GaP (gallium phosphide), InGaP (indium gallium phosphide), GaN (gallium nitride), InGaAs (indium gallium arsenide), GaInNAs (indium gallium arsenide nitride), InP (indium phosphide), GaInP (gallium indium phosphide) or others. These are all direct bandgap semiconductors; indirect bandgap semiconductors such as silicon do not exhibit strong and efficient light emission.

Semiconductor lasers or laser diodes play an important part in our everyday lives by providing cheap and compact lasers used for various applications such as optical communications, sensing, metrology, displays, lighting, material processing and others. Their typical size is in the order of mm, they are made up of complex multi-layer structures requiring nanometer scale accuracy and are carefully and elaborately designed for best performance.

A laser is characterized by multiple key parameters such as wavelength of operation, output power, threshold current, wall-plug efficiency, beam quality and others, depending on application. Of particular interest for many applications are lasers whose wavelength of operation can be altered in a controlled manner; such lasers are commonly called tunable lasers. Tunable lasers are typically single frequency lasers meaning that output power at one frequency is significantly larger than all other peaks in the emission spectrum. The parameter to determine the level of single frequency purity is the side mode suppression ratio (SMSR), defined as the ratio of power in the center peak longitudinal mode to the power in the nearest higher order mode. In some typical cases a threshold of a SMSR>30 dB is considered to characterize the laser as a single frequency laser. In applications requiring high spectral purity the threshold can be >45 dB or even higher. In yet other applications, where it is hard to provide such high SMSR ratios due to various limitations (e.g. mirror and filter quality), single-frequency lasers can have SMSR of only around 20 dB or lower.

The wavelength of a tunable laser is defined both by the gain medium (defining the spectral range in which lasing is possible) and the cavity comprising the mode-selection filter. There are multiple architectures to provide mode-selection filtering as will be described below, but, in all cases for tunable lasers, one or more controls capable of changing the characteristics of the mode-selection filter are necessary. Despite the advanced laser designs employed and high accuracy of semiconductor processing, the output wavelength of a semiconductor laser varies within a die, between dies across a wafer, and from wafer to wafer, due to differences in layer thicknesses, waveguide widths, sidewall angles, material imperfections and other factors, all of which are present in a practical process. Due to said differences, the output wavelength between nominally identically designed lasers varies and calibration is generally necessary. Said calibration often requires expensive instruments (e.g. optical spectrum analyzer or a wavemeter), and is time consuming, especially for widely-tunable lasers. A typical result of such calibration would be a look-up table (LUT) summarizing the output wavelength and SMSR (and/or other laser parameters) as a function of laser control signals. Generation of such LUT can take hours or more, depending on the laser design and precision necessary, limiting the throughput in manufacturing such lasers. Furthermore, calibration is performed early in the laser life cycle and output wavelength variations can be caused later on due to changes in internal temperature, carrier lifetime, defects propagation, physical movements for packaged devices (e.g. solder relaxation) or others limiting the precision of the LUT. This is especially challenging if lasers are to be operated in uncooled environments where ambient temperature can vary by 50° C. or more and provides additional stress to the laser.

There remains a need for chip-scale tunable semiconductor lasers providing high level of wavelength control and stability with no external calibration, or with only minimal external calibration prior to the deployment for significant cost and performance improvement. The ability to support re-calibration while deployed, controlled continuous wavelength tuning, and high-precision reference locking is also desirable.

DETAILED DESCRIPTION

Embodiments described herein are directed to the realization of tunable chip-scale semiconductor lasers in photonic integrated circuits with improved performance and additional functionality over currently available devices.

In the following detailed description, reference is made to the accompanying drawings which form a part hereof, wherein like numerals designate like parts throughout, and in which are shown by way of illustration embodiments in which the subject matter of the present disclosure may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

The description may use perspective-based descriptions such as top/bottom, in/out, over/under, and the like. Such descriptions are merely used to facilitate the discussion and are not intended to restrict the application of embodiments described herein to any particular orientation. The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

A photonic integrated circuit (PIC) or integrated optical circuit is a device that integrates multiple photonic functions and as such is analogous to an electronic integrated circuit.

The term "coupled with," along with its derivatives, may be used herein. "Coupled" may mean one or more of the following. "Coupled" may mean that two or more elements are in direct physical, electrical, or optical contact. However, "coupled" may also mean that two or more elements indirectly contact each other, but yet still cooperate or interact with each other, and may mean that one or more other elements are coupled or connected between the elements that are said to be coupled with each other.

Figure 1:
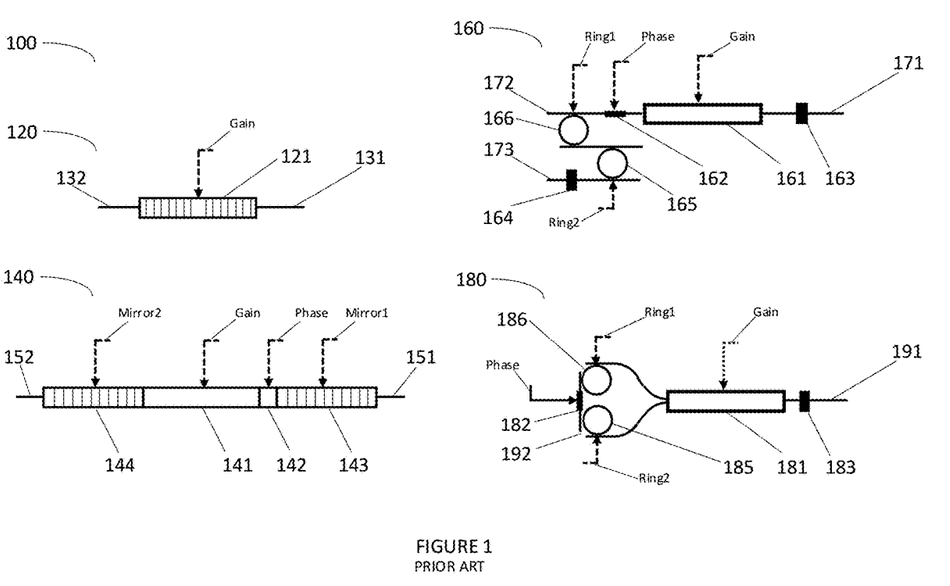
FIG. 1 (Prior Art) shows a top-down view of a prior art device.

FIG. 1 (prior art) shows top-down views of several tunable chip-scale semiconductor lasers. Device 120 is a distributed feedback (DFB) laser where the active region 121 providing gain contains a periodically structured element or diffraction grating used for longitudinal mode filtering and forming the cavity, outputting power to both left side 132 and right side 131. A well designed DFB laser tends to be very stable and provide limited tuning (several 100s of GHz) with no mode hops either by directly modulating the gain or by heating the device. In both cases, the wavelength tuning generally results in output power changes unless additional amplifiers are utilized. The wavelength variation between nominally identical devices primarily stems due to the fabrication variation, especially the variation of the grating structure that often includes very fine features with dimensions of the order of 100s of nanometers. Distributed Bragg reflector (DBR) lasers are similar to DFB lasers, with the difference being that the longitudinal mode filtering element is external to the gain region (not shown). Wavelength tuning in DBR laser can also be obtained by changing the index of the grating sections either by utilizing thermo-refractive or carrier plasma effect.

Device 140 is a sampled-grating distributed Bragg reflector (SGDBR) laser providing larger tuning range than the DFB laser but said tuning is not continuous and results in mode-hops as will be described with the help of FIG. 2. The SGDBR comprises four sections: first mirror 143, second mirror 144, gain region 141 and phase region 142. The SGDBR laser has nominally two outputs 151 and 152, and the powers emitted to said outputs do not have to be substantially similar as the reflectivities of mirrors 143 and 144 can be different. This can improve single-side wall-plug efficiency. Each of the mirrors 143 and 144 is realized as a sampled periodic structure (grating). By sampling the grating, multiple reflectivity peaks are formed. These peaks are spaced apart in wavelength domain at a period inversely proportional to the period of the sampling in physical space. The two mirrors of the laser are sampled at different periods such that substantially only one of their multiple reflection peaks can coincide at a time in the bandwidth range defined by the gain medium, as may be understood in terms of the Vernier effect. Narrow-band tuning, performed by careful control of all tuning signals, allows continuous tuning in limited range (several 100s GHz nominally). Wide-band tuning is realized utilizing the Vernier effect between said mirrors. When providing wide-tuning, the laser can mode-hop producing both phase and frequency discontinuity. SGDBR lasers can provide several THz of tuning range or more, but due to fabrication imperfections, packaging and other effects the output wavelength varies between nominally identical devices driven with identical control signals.

Device 160 is a ring-resonator-based (RRB) tunable laser providing large tuning range, but said tuning is not continuous and results in mode-hops as will be described with the help of FIG. 2. The RRB laser comprises several key elements: first mirror 163, second mirror 164, gain region 161, phase region 162 and frequency selective structure realized as two add-drop ring resonators 165 and 166. Each ring has multiple resonances in the frequency/wavelength domain with spacing determined by the free-spectral range which is the inverse of the round-trip time inside the resonator. By designing two (or more) ring resonators to have slightly different round-trip time, wide tuning can be realized utilizing the Vernier effect. The tuning of RRB lasers is similar to the tuning of SGDBR lasers as described above with multiple control signals (gain, ring 1, ring 2, phase), but due to generally higher quality filtering provided by the ring-resonators, tuning ranges larger than 10 THz can be provided. Similarly, due to fabrication imperfections, packaging and other effects, the output wavelength varies between nominally identical devices driven with identical control signals. RRB laser 160 has nominally two outputs 171 and 173, and powers outputted can be controlled by the mirror reflectivities allowing for dominantly single-side output and increase in single-side wall-plug efficiency. The output of the RRB laser can also be monitored at other ports, e.g. port 172.

Device 180 is another embodiment of an RRB laser, in which the functionality of one of the mirrors is replaced by a combination of two ring resonators 185 and 186. Device 180 comprises several key elements: mirror 183, gain region 181, phase region 182 and a frequency selective structure realized as two add-drop ring resonators 185 and 186 providing the "second mirror" functionality. The operation of device 180 is identical to the operation of device 160, utilizing multiple control signals to provide tuning (gain, ring 1, ring 2, phase). Various other combinations of ring-resonators, including changing the number of ring resonators and their arrangements can be utilized to realize wide tunability of RRB lasers.

The devices in FIG. 1 only illustrate some examples of tunable lasers and many more architectures have been demonstrated, but all provide similar levels of functionality from limited tuning range DFB style lasers (several GHz tuning range) with simplified control to widely-tunable lasers (THz or more tuning range) with more complex control and phase/frequency discontinuities when wide tuning is employed. Any of said lasers can be integrated with semiconductor optical amplifiers (SOAs) to provide power amplification, rapid output power control or additional functionality (not shown). Any of said lasers can be integrated with photodetectors to provide additional monitor ports and simplify control, e.g. the optimization of the SMSR by maximizing photocurrents (laser output power).

Figure 2:
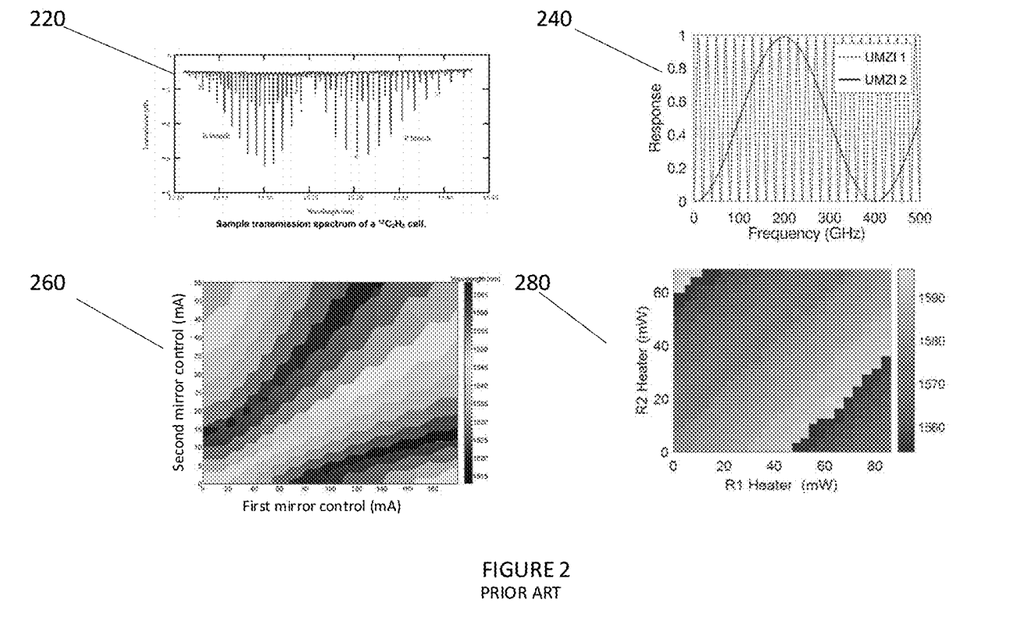
FIG. 2 (Prior Art) shows measured and simulated responses of frequency selective elements typically utilized in widely-tunable lasers, and measured tuning maps or look-up 10 tables (LUTs) for laser wavelength control.

FIG. 2 (prior art) shows standard techniques used to control laser tuning. A common class of widely tunable lasers is made up of external-cavity tunable lasers, utilizing diffraction gratings. Such lasers are bulkier than the semiconductor tunable lasers described in relation to FIG. 1, often more expensive and generally used as benchtop tunable lasers. Properly designed external-cavity tunable lasers can provide very broadband tuning (>10 THz) with no mode-hops, providing continues phase/frequency change and simplifying the determination of operational wavelength, which is generally controlled by adjusting the diffraction grating position (plus other controls needed to prevent mode-hops). To further improve the wavelength precision, a combination of a reference cell and wavemeter may be utilized. A reference cell usually contains a gas with well-defined resonances (lines), such as those in the example shown at 220, corresponding to acetylene ($^{12}C_2H_2$). Of course, other suitable molecular or atomic gases may be used in other examples. A reference cell can serve as an absolute wavelength calibration source because the reference cell will only absorb light at wavelengths that correspond to the allowed transitions between energy levels of the material inside the reference cell. Such an absolute reference is often combined with a relative reference, usually realized as unbalanced interferometer, as used for example in the example indicated at 240. In 240, responses of two unbalanced Mach-Zehnder interferometers are shown, corresponding to two different path length imbalances, with UMZI 1 providing fine resolution and UMZI 2 providing a larger span for easier matching to absolute reference transitions. Directing part of the continuously tuned, mode-hop free laser light to the reference cell and another part to an unbalanced Mach-Zehnder interferometer allows for precise monitoring, as the higher-resolution relative reference can be mapped to the absolute reference for high absolute wavelength precision in sub-GHz range across the full wide tuning range.

Controlled tuning of widely-tunable chip-scale lasers is more complicated due to the above mentioned mode-hops as the Vernier jumps to different wavelengths in steps of one free spectral range of the frequency selective structures. A typical tuning map of an SGDBR laser is shown in view 260, and a typical tuning map of an RRB laser is shown in view 280. In each case, there is a limited continuous tuning range (typically several 100s of GHz) where mode-hop free tuning can be performed by proper control of all tuning elements. The range is limited because of a corresponding tuning range limitation of either the frequency selective elements (gratings and/or ring resonators), or the phase section aligning the longitudinal mode, or both. The mode-hop tuning range can be extended with careful design of all the elements, but cases of very broad tuning will always result in a mode hop.

The mode-hops, combined with fabrication variation impacting wavelength of operation between nominally identical devices greatly complicates the precise control of the laser wavelength. The turn-on wavelength with all controls at some nominal settings is a statistical parameter depending on the process. If the laser could be continuously tuned, the laser wavelength determination could be simplified by utilizing absolute and relative wavelength references (as described with relation to 220 and 240) and tuning the laser at least once through the full range, capturing the responses of both references and measuring the absolute wavelength as a function of control signals. This measurement method is not possible if the laser exhibits mode-hops through the range, as mode hops break the continuity of the relative reference 240 and make the fitting to the response of absolute reference 220 significantly more challenging.

Commercial chip-scale lasers, for the reasons discussed above, are often pre-tested utilizing external systems such as optical spectrum analyzers or wavemeters, capable of measuring the absolute wavelengths. During such measurements, a look-up table (LUT) is generated, mapping the output wavelength and other relevant parameters (e.g. SMSR) as a function of laser control signals. Generation of LUTs can take extended periods of time (up to hours or more depending on the laser design and precision necessary), limiting the throughput in manufacturing such lasers, especially if wide operating temperature ranges have to be supported. Furthermore, calibration is performed early in the laser life cycle and output wavelength can then drift with time or even hop due to such factors as changes in internal temperature, carrier lifetime, semiconductor defect propagation, or physical shifts within packaged devices (e.g. solder relaxation), which limit the precision of the LUT approach. This is especially challenging if lasers are to be operated in uncooled environments, where larger temperature ranges generate additional stress to the laser and the package. For all these reasons, the cost of qualified widely-tunable lasers is generally high, and may preclude their use in cost-sensitive market applications.

Several chip-scale components, such as arrayed waveguide gratings (AWGs) and echelle gratings for example, can provide wavelength selective responses suitable for determining absolute wavelength. Both of those examples are commonly used for multiplexing and demultiplexing optical signals in e.g. wavelength division multiplexing systems (WDM) and are well known to a person skilled in the art.

An AWG consists of an input star coupler, an array of waveguides, and an output star coupler. When operating as a demultiplexer, light coming from the input waveguide enters the input star-coupler and is distributed over the arrayed waveguides through in-plane diffraction. After propagating through the waveguide array, contributions coming from all waveguides interfere in the output star coupler. The phase difference in the array waveguides changes with wavelength, which will introduce a lateral shift of the field in the image plane, and the light will be coupled into a particular one of the output waveguides depending on its wavelength.

The operating principle of an echelle grating is similar to that of an AWG in the sense that multi-path interference with a set of equally spaced delay lengths is used. However, the delays are now implemented in the free propagation region itself, using reflective facets. This means that the same slab area is used for diffraction and refocusing. While this is a more efficient use of space it puts restrictions on the position of the input and output waveguides.

Figure 3:
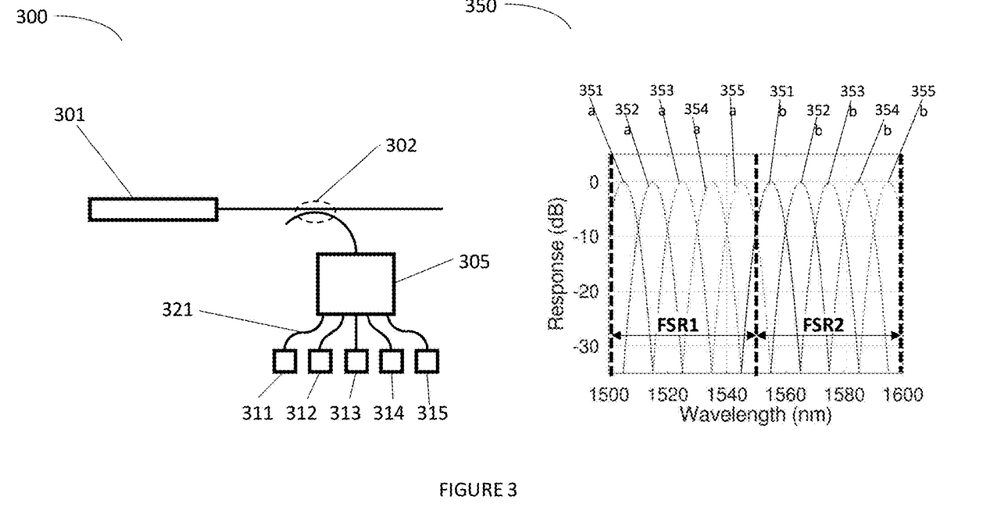
FIG. 3 shows a top-down view of a device according to some embodiments of the present invention.

FIG. 3 shows a top-down view of one embodiment 300 of the current invention in which a tunable laser 301 is optically coupled to frequency selective element 305. Said coupling can be realized using an optical coupler 302 to tap a part of the laser output power as shown in FIG. 3, or the frequency selective element 305 can be optically coupled utilizing other laser outputs (not shown) as suggested in FIG. 1 with or without the optical coupler 302. In all embodiments, a part of the laser output reaches the frequency selective element 305. The frequency selective element 305 can be an AWG, echelle grating, and/or another element or elements providing responses suitable for determining absolute wavelength (e.g. thin-film filters). The portion of laser output incident on frequency selective element 305 is de-multiplexed to couple into two or more photodetectors (five such, 311-315, are shown in FIG. 3).

In one embodiment, the ratio of power incident on each of the photodetectors 311-315 is a function of wavelength as shown, for example, in 350, in which the wavelength response of one particular frequency selective element 305 is shown. In the illustrated case, the frequency selective element 305 comprises five outputs, and the response is correspondingly periodic (cyclic) due to the response being a function of accumulated phase as a function of wavelength. Said periodicity defines a free spectral range (FSR), two of which (FSRs) are illustrated in exemplary wavelength response 350. Cyclical responses defining FSR can be designed to have gaps between said repeating wavelength responses, or they can be designed so there are no gaps between said repeating wavelength responses as shown in exemplary response 350. In the embodiment shown in 350, the wavelengths defined by the curves 351a and 351b will transmit at least part of the incident light to the photodetector 311, similarly 352a and 352b will transmit at least part of the incident light to the photodetector 312, etc. A determination of absolute frequency of an incident light signal can be made by detecting which of the detectors 311-315 registers the largest power fraction of the incident light, allowing for coarse determination of operating wavelength. A more precise measurement can utilize the ratio of powers between two neighboring detectors whose responses are the largest, e.g. in a specific case where the incident optical signal is at 1520 nm wavelength, responses of 352a and 353a would be substantially similar and small changes in wavelength can be determined by fitting the measured power ratio to the assumed shape of the filters (e.g. gaussian) or the measured shape of the filter.

In communication applications, the crosstalk between neighboring channels of the frequency selective element is usually minimized by design for best performance. In this disclosure, the crosstalk is a beneficial characteristic, as the power ratio calculation can be utilized over a broader wavelength range. In some embodiments, the crosstalk between channels is larger than −40 dB, in yet other embodiments the crosstalk is as large as −3 dB.

As the detection of operating wavelength depends only on the powers and power ratios between photodetectors, it is straightforward to determine laser operating wavelength regardless of mode-hops, allowing for direct measurement either during testing or deployment of tunable laser 300. The frequency selective element 305 can also be utilized for the generation of a LUT, without utilizing external components as will be described with the help of FIG. 7.

In some embodiments, the tuning range of the laser 301 is smaller than the FSR of the frequency selective element 305 allowing for unambiguous determination of the wavelength. In some embodiments, the discrete photodetectors 311-315 can be replaced by an array of photodetectors (not shown). In such embodiments, direct coupling from frequency selective element 305 to the photodiodes may be achieved, without any need for intervening waveguides such as waveguide 321.

Figure 4:
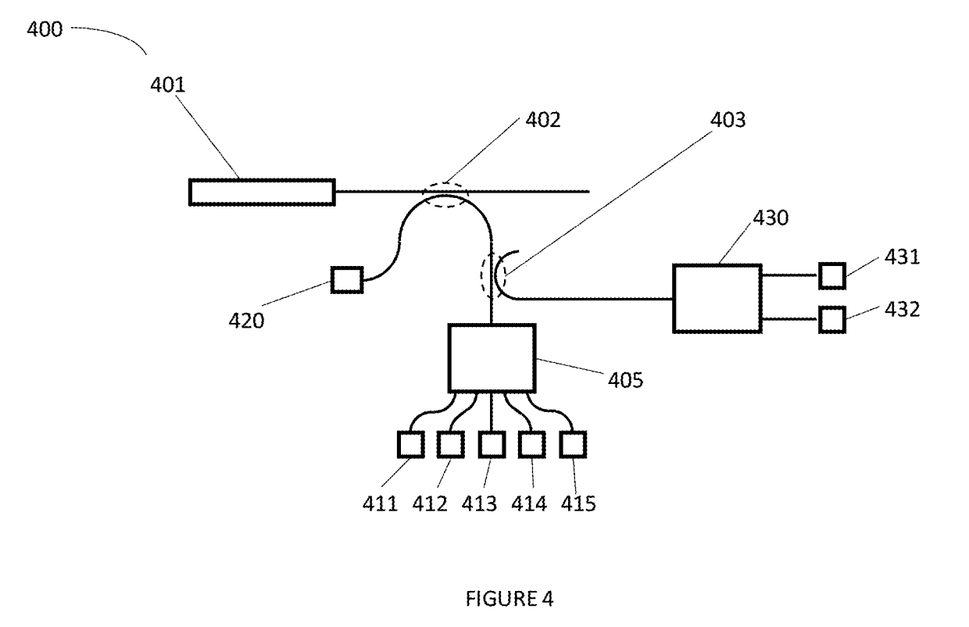
FIG. 4 shows a top-down view of a device according to some embodiments of the present invention.

In some embodiments (not shown), an additional external port is present at coupler 302, similar to port 420 shown in FIG. 4. This (optional) port enables an external optical source (not shown) to be coupled to the tunable source 300 and more specifically to frequency selective element 305.

Figure 5:
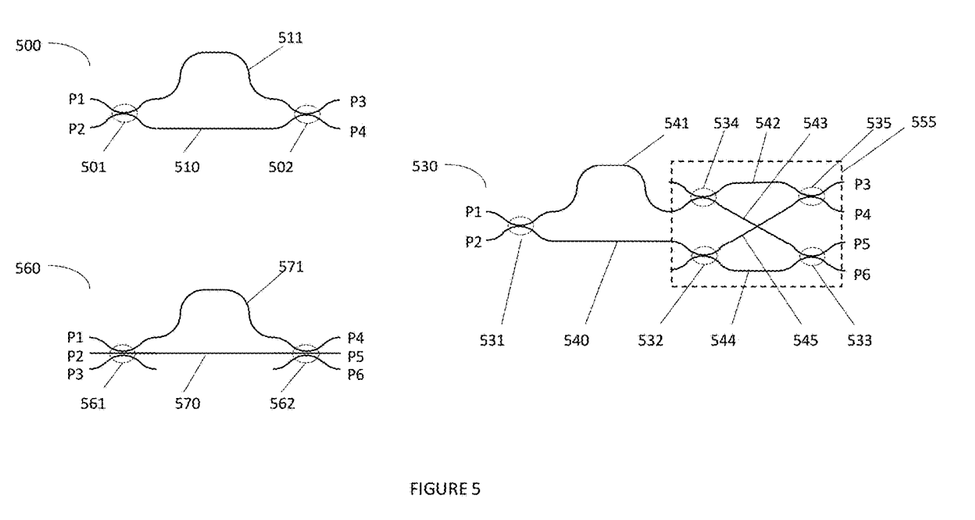
FIG. 5 shows a top-down view of elements of a device according to some embodiments of the present invention.

FIG. 4 shows a top-down view of one embodiment 400 of the current invention in which a tunable laser 401 is optically coupled to frequency selective element 405 and unbalanced interferometer 430. Said coupling can be realized using one or more optical couplers 402 and/or 403 to tap a part of the laser output power as shown in FIG. 4, or the frequency selective element 405 and unbalanced interferometer 430 can be optically coupled utilizing other laser outputs (not shown) as suggested in FIG. 1 with or without the optical couplers 402 and/or 403. The frequency selective element 405 is as described in relation to FIG. 3, with respect to element 305. At least part of the laser output is incident on the unbalanced interferometer 430 with functionality as discussed above for view 240 of FIG. 2. The output of unbalanced interferometer 430, to be described in more detail in relation to FIG. 5, is optically coupled to one or more photodetectors, two being shown in FIG. 4 as 431 and 432. Said photodetectors can track the output from the unbalanced interferometer and determine continuous wavelength change during regions under which laser tunes mode-hop free, as explained above in relation to FIG. 2. The precision of unbalanced interferometer can be higher (e.g. MHz range) than that afforded by frequency selective element 405 alone, and can supplement the wavelength determination by frequency selective element 405, or provide a high-quality frequency sweep monitor to e.g. linearize the tuning of the laser. The unbalanced interferometer 430 can comprise multiple delays to provide fine and coarse frequency resolution sweeps (not shown) as described in relation to FIG. 2. The unbalanced interferometer 430 can also be utilized for controlled continuous tuning without utilizing external components as will be described with the help of FIG. 8. The sensitivity of the wavelength response of frequency selective elements 305 and 405 to fabrication imperfections is typically lower than the sensitivity of the tunable laser itself, allowing for significantly improved wavelength control. Still, phase variation can lead to absolute wavelength offsets that can limit the precision of the chip-scale wavelength control.

In some embodiments, additional external port 420 is introduced. This (optional) port enables an external optical source (not shown) to be coupled to the tunable source 400 and more specifically to frequency selective element 405. Said external optical source can be used to calibrate the frequency selective element 405 to account for process variations. Calibration is straightforward as the wavelength of the external optical source has to be swept at least once while capturing the responses of the detectors 411-415, and/or detector arrays, from which calibration of the frequency selective element 405 can easily be computed using the ratios of said wavelength responses of the detectors. This step can be performed during initial screening of the laser, and once calibration of frequency selective element 405 is performed, the laser LUT can be generated with additional precision without using external components. Calibration using an external optical source can also be performed after packaging, or during the operational lifetime of the tunable laser, as needed.

In some embodiments, the external source is a single-frequency laser used to correct for a known response from frequency selective element 405, due to phase imperfection. In this simplified case of calibration, the full response of the frequency selective element 405 is obtained from simulations or measurements of nominally identical devices (that differ in performance due to fabrication imperfections) and a small correction using a single-frequency laser is applied to match the measured response wavelength to the controlled input wavelength of the single frequency laser.

External port 420 can be realized in multiple ways to enable coupling of external sources. In some embodiments, external port 420 is a grating coupler enabling wafer scale testing. In other embodiments, external port 420 is an edge coupler enabling more broadband operation compared to a grating coupler.

In yet other embodiments, an additional external port (not shown) can be introduced to provide optical coupling of tunable laser 401 to one or more stable external references such as molecular or atomic gases in a cell. The laser can be tuned close to the resonance of the gas in the cell using the response of frequency selective element or LUT, and then locked to the stable reference (resonance) to provide highly precise wavelength control.

FIG. 5 depicts schematic drawings of exemplary designs of unbalanced interferometers corresponding to element 430 in FIG. 4.

Unbalanced interferometer 500 comprises optical 2×2 couplers 501 and 502, and arms 510 and 511 connecting those couplers together. Arms 510 and 511 have different optical lengths, with a length difference determining the free-spectral range (FSR) or the resolution of the interferometer. In general, the precision afforded by interferometer 500 increases with increasing length difference between arms 510 and 511; however, in cases where propagation loss is non-negligible, an increase in imbalance can lead to a reduction of the extinction ratio of the interferometer. The unbalanced interferometer 500 has four input/output ports labeled P1-P4. Either of ports P1 and P2 can be used as the input to the wavemeter and any or both of ports P3 and P4 can be used as the output connected to photodetector(s) such as 431 and 432 described in relation to FIG. 4. As the wavelength or frequency of the input signal is changed, portions of that signal interfere with a different delay at output coupler 502 and the output from the interference is routed with a correspondingly changing ratio between ports P3 and P4. As the wavelength changes by one FSR, the output at a particular port changes between a maximum and a minimum value, and the power change can be used to estimate the change of the wavelength of the optical source.

Unbalanced interferometer 530 comprises five optical 2×2 couplers—specifically, couplers 531, 532, 533, 534 and 535, four of which comprise an I/Q demodulator 555 that is operative for extracting the phase of a signal, thereby enabling the direction of a wavelength change to be determined (distinguishing between an increase and a decrease of the wavelength). The unbalanced interferometer 530 has six input/output ports labeled P1-P6. In operation, coupler 531 splits an input signal from either of ports P1 and P2, sending one portion to arm 540 and the other to arm 541. Similarly to unbalanced interferometer 500, the difference in the lengths of arms 540 and 541 determines the FSR. These two signals are then sent as an input to the coherent or I/Q demodulator 555. The coherent demodulator allows for full phase demodulation and comprises couplers 532, 533, 534, 535 and arms 542, 543, 544 and 545. The four arms 542, 543, 544 and 545 are of substantially equal length, except one that is preferably longer by a length corresponding in phase to approximately 90 degrees at the center operational wavelength of the device. The unbalanced interferometer 530 enables full detection of an incoming signal including the phase estimation, which allows for more precise estimation of the frequency between the FSR fringes as well as for the detection of the direction of wavelength change, as is known in the art of coherent receivers. For optimal detection, all of ports P3-P6 are used, but precise wavelength estimation is also possible by using only two of these ports whose phase difference is other than 180 degrees. The coupler splitting ratios are preferably optimized for maximum extinction ratio, but precise wavelength measurements are possible even in the case of largely unbalanced powers and reduced extinction ratio at the photodetectors (not shown).

Unbalanced interferometer 560, like 530, is operative for extracting the phase of the signal, which enables determination of the direction of a wavelength change. Unbalanced interferometer 560 includes 3×3 optical couplers 561 and 562, which are optically coupled with arms 570 and 571. Arms 570 and 571 are of different length, where the length difference determines the FSR. The 3×3 couplers are characterized by a phase difference between their output ports that is substantially different than 90 degrees and in some embodiments is substantially equal to 120 degrees. The unbalanced interferometer 560 has six input/output ports labeled P1-P6. Any of ports P1, P2 and P3 can be used for input and any or all of ports P4-P6 can be used for output. However, when only one output port is used, only fringe counting is possible, while the use of two or three output ports enables full phase detection. In an optimal case, the coupling coefficients of couplers 561 and 562 are selected such that the optical power in arms 570 and 571 is substantially equal at the coupler 562. Such a device has a maximized extinction ratio, in theory approaching infinity. Precise wavelength measurements are possible even in case of largely imbalanced powers and reduced extinction ratio, provided that the signal at the photodetectors (not shown) is sufficiently above all the noise sources.

Other unbalanced interferometer architectures can be utilized, as is known to someone skilled in the art.

Figure 6:
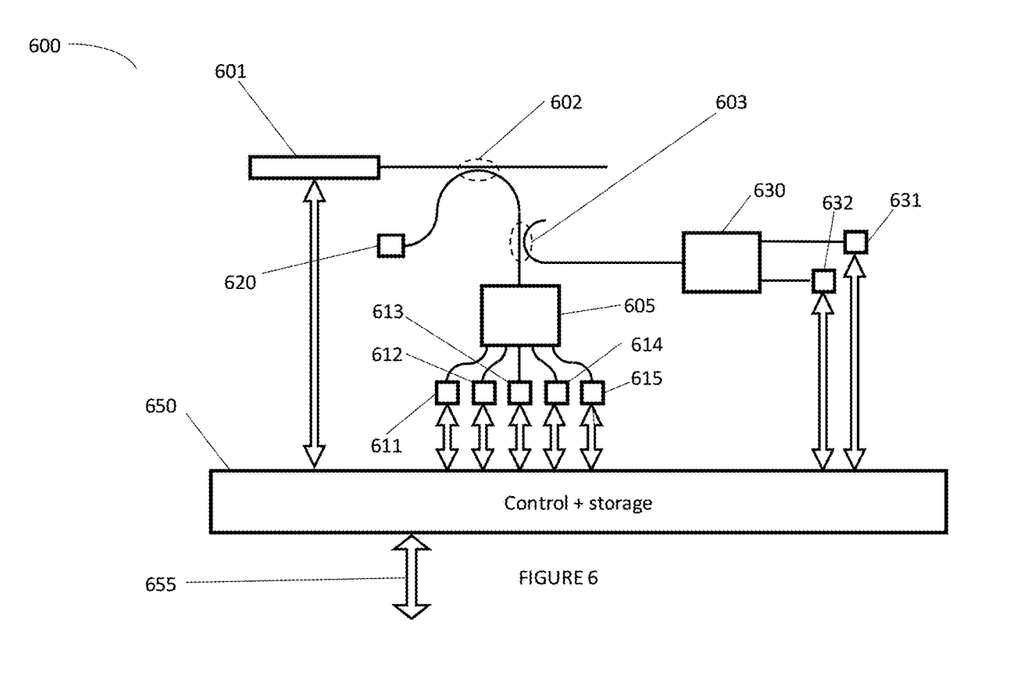
FIG. 6 shows a top-down view of a device according to some embodiments of the present invention.

FIG. 6 shows a top-down view of one embodiment 600 of the current invention in which a tunable laser 601 is optically coupled to frequency selective element 605 and unbalanced interferometer 630. Elements 601, 602, 603, 605, 611, 612, 613, 614, 615, 620, 630, 631 and 632 correspond to elements 401, 402, 403, 405, 411, 412, 413, 414, 415, 420, 430, 431 and 432 respectively, as discussed above in relation to FIG. 4.

All the active elements (capable of light generation, detection and modulation) are electrically connected to element 650, which provides control functionality for those elements, and storage for corresponding LUTs. Each active element might require multiple electrical connections to provide full device control (e.g. laser gain, phase, frequency selective elements, monitor photodetectors in the case of tunable laser 601) as needed for the operation of device 600. Said connections might provide current control and/or voltage control, and might be bidirectional, meaning that in some connections the signals are generated in the element 650, while in others the signals are generated in the device to which element 650 is connected, and element 650 is capable of reading said signals and performing calculations using said signals. Examples of element 650 include, but are not limited to, microcontrollers, field programmable gate arrays (FPGAs) and/or application-specific integrated circuits (ASICs) with internal memory storage and/or external memory storage. Element 650 is capable of generating multiple control signals, reading multiple signals from external elements (such as e.g. tunable laser 601), and storing data such as LUTs and/or other relevant for device operation.

Connections 655 can serve to enable communication between element 650 with other devices utilizing any of the popular interfaces such as USB, Ethernet, wireless networks, Bluetooth, and/or provide a direct control interface (e.g. touchscreen). The purpose of connections 655 is to provide the input to device operation and provide wavelength control of the tunable laser to the user.

Figure 7:
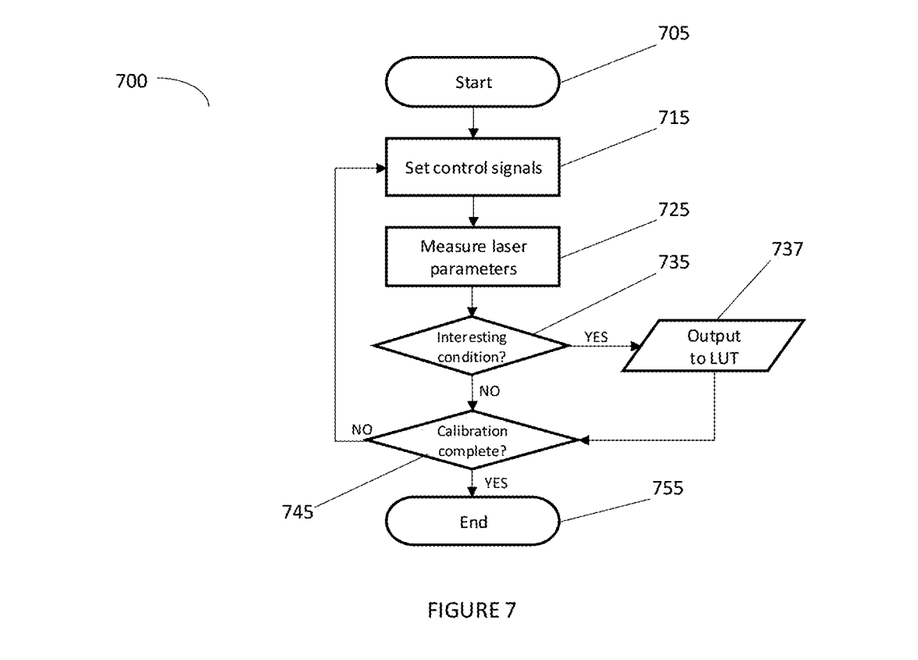
FIG. 7 depicts operations of methods associated with the calibration and operation of a tunable laser, in accordance with various embodiments described herein.

FIG. 7 depicts operations of a method for generating a look-up table (LUT) in accordance with an illustrative embodiment of the present invention. Method 700 begins with operation 705, wherein the laser is operational, meaning all necessary control signals, including thermal control (if available), are powered on and stabilized from transients. Control signals comprise one or more current/voltage signals used to control laser operation including controls for optical power (e.g. gain, additional amplifiers), monitor elements (e.g. photodiodes) and tuning elements such as phase control and frequency selective elements (e.g. ring resonators, gratings and/or others) to enable laser tuning. Some controls can result in both wavelength and power control (e.g. gain). The process of generation of a LUT then proceeds to step 715 in which control signals are set. The set values may be determined by a random process, or according to expected LUT values (obtained previously from e.g. similar devices, simulations, etc.), or according to one or several gradient or other optimization routines. Once control signals are set, the on-chip frequency selective element is used in operation 725, to measure the laser wavelength and other parameters of interest as described above in relation to FIG. 3.

In operation 735, the laser's measured parameters such as wavelength, output power, power in center peak longitudinal mode vs total integrated power (captured by all photodetectors) and/or others can be used to determine if the current settings for the laser (the device) have provided a laser output likely to be of interest for future device operation. If they have, the current control signals' values are stored in a LUT in operation 737 before proceeding to operation 745. In cases where the current laser output is not of interest, the corresponding device settings are not worth storing in the LUT, so the method can proceed directly from operation 735 to operation 745 where it is decided whether additional control signals should be evaluated. If additional evaluations of control signals are desired, to provide additional data for the LUT, the method proceeds to operation 715 repeating the flow described above. When it is determined at operation 745 that there is no need for further evaluation of control signals, the method of generating the LUT is completed at operation 755, after which the laser may be set to a desired wavelength, turned off, or otherwise operated as desired.

Figure 8:
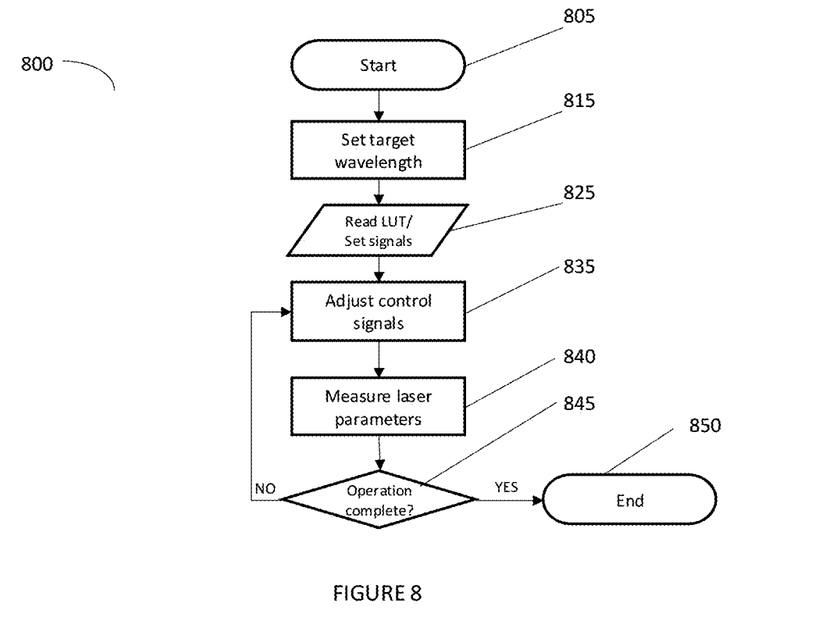
FIG. 8 depicts operations of methods associated with the controlled continuous tuning operation of a tunable laser, in accordance with various embodiments described herein.

FIG. 8 depicts operations of a method for utilizing the look-up table (LUT) and unbalanced interferometer to provide controlled continuous tuning around wavelength of interest in accordance with an illustrative embodiment of the present invention.

Method 800 begins with operation 805, wherein the laser is operational, meaning all necessary control signals, including thermal control (if available), are operational. The method then proceeds to step 815 in which a target laser wavelength of operation is set. The method then proceeds to step 825 in which stored LUT values, corresponding to the target laser wavelength setting, are read and set as control signals for the laser resulting in the laser operating at a wavelength substantially similar to the target laser wavelength.

Once the laser is operating close to the wavelength of interest, precise tuning control can be implemented by adjusting control signals in step 835. In some embodiments, said adjustment would tune one control signal while monitoring an aspect of laser performance (e.g output power and/or one or more other relevant parameters) and applying a small dither to other control signals to prevent mode-hops. In some embodiments, the control of mode-hopping can be as simple as maximizing the output power without changing the laser bias current. The range in which such continuous tuning is possible, in some embodiments, can be determined from LUT. With every adjustment of control signals, the method may proceed to step 840 in which laser operating parameters are measured utilizing one or both of the frequency selective element and unbalanced interferometer. The signals from the frequency selective element are preferably utilized to monitor the coarse absolute wavelength of laser operation and can be used to trigger calibration by initializing method 700 in cases where the output wavelength corresponding to set signals deviates by more than a predetermined amount. The signals from the unbalanced interferometer are preferably utilized to monitor continuous tuning, optionally including measurements used to linearize the laser tuning as described in relation to FIGS. 2 and 5.

In operation 845, a decision is made on whether the method is complete or additional control signal adjustment is needed. If additional evaluations of the control signals for the reason of controlled tuning are desired, the method proceeds to operation 835 repeating the flow described above. If there is no need for further controlled tuning, the method of providing continuous tuning is completed at 850, after which the laser may be left operating at the target wavelength, turned off, or operated otherwise as desired.

In some embodiments, complete functionality of the photonic subsystem is realized on a single, common substrate using heterogeneous integration. In some embodiments, parts of the photonic subsystem are realized as discrete chips that are optically coupled using hybrid integration techniques. In some embodiments, for better thermal isolation between lasers and other wavelength selective elements, method such as deep trenches etched into the common substrate are applied.

Embodiments of the semiconductor lasers described herein may be incorporated into various other devices and systems including, but not limited to, various optical networks, various computing and/or consumer electronic devices/appliances, communication systems, sensors and sensing systems.

It is to be understood that the disclosure teaches just a few examples and illustrative embodiments, that many variations of the invention can easily be devised by those skilled in the art after reading this disclosure, and that the scope of the present invention is to be determined by the following claims.

The invention claimed is:

1. A device comprising:
   a first element, comprising a tunable semiconductor laser, emitting light at a laser output wavelength;
   a second element, comprising a wavelength selective element, coupled to the first element;
   a third element, comprising N photodetectors where N>=2, coupled to the second element
   a fourth element, comprising an unbalanced interferometer, coupled to the first element; and
   a fifth element, comprising one or more photodetectors, coupled to the fourth element;
   wherein light coupled from the first element into the second element is de-multiplexed by the wavelength selective element such that a ratio of light power coupled from the second element into one of the N photodetectors to light power coupled from the second element into another one of the N photodetectors is a function of the laser output wavelength;

wherein the unbalanced interferometer in the fourth element acts on light coupled into the fourth element such that light power delivered to each of one or more of the fifth element photodetectors is a function of the laser output wavelength;

wherein responses of the N photodetectors in the third element enable at least one of measurement and control of the laser output wavelength;

wherein responses of the one or more photodetectors in the fifth element enable controlled continuous tuning of the laser output wavelength; and wherein first, second and third elements are realized as photonic integrated circuits.

2. The device of claim 1, wherein the wavelength selective element is an arrayed waveguide grating.

3. The device of claim 1, wherein the wavelength selective element is an echelle grating.

4. The device of claim 1, wherein the third element comprises an array of photodetectors, directly coupled to the second element without any intermediary waveguides.

5. The device of claim 1, wherein the unbalanced interferometer is an unbalanced Mach-Zehnder interferometer.

6. The device of claim 5, wherein the unbalanced Mach-Zehnder interferometer comprises 3×3 optical couplers.

7. The device of claim 1, wherein the first, second, third, fourth and fifth elements are fabricated on a common substrate using heterogeneous integration.

8. The device of claim 1, wherein a sixth element comprising an external port is optically coupled to the second and fourth elements.

9. The device of claim 8, wherein the first, second, third, fourth, fifth and sixth elements are fabricated on a common substrate using heterogeneous integration.

* * * * *